US010388911B2

(12) United States Patent
Hamada et al.

(10) Patent No.: US 10,388,911 B2
(45) Date of Patent: Aug. 20, 2019

(54) DISPLAY DEVICE AND MANUFACTURING METHOD THEREOF

(71) Applicant: Japan Display Inc., Tokyo (JP)

(72) Inventors: Yuki Hamada, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/628,973

(22) Filed: Jun. 21, 2017

(65) Prior Publication Data
US 2018/0013096 A1 Jan. 11, 2018

(30) Foreign Application Priority Data
Jul. 7, 2016 (JP) .................................. 2016-134746

(51) Int. Cl.
| H01L 29/08 | (2006.01) |
| H01L 31/036 | (2006.01) |
| H01L 35/24 | (2006.01) |
| H01L 51/52 | (2006.01) |
| H01L 27/32 | (2006.01) |
| G06F 3/041 | (2006.01) |
| G06F 3/044 | (2006.01) |

(52) U.S. Cl.
CPC .......... *H01L 51/5256* (2013.01); *G06F 3/044* (2013.01); *G06F 3/0412* (2013.01); *H01L 27/323* (2013.01); *H01L 27/3276* (2013.01); *H01L 51/5246* (2013.01)

(58) Field of Classification Search
CPC ............ H01L 51/5256; H01L 51/5246; H01L 27/322; H01L 51/5284; H01L 27/323; H01L 21/3241; H01L 51/5237–5256
See application file for complete search history.

(56) References Cited

U.S. PATENT DOCUMENTS

| 9,064,828 B2 * | 6/2015 | Oh ...................... H01L 51/5253 |
| 9,843,022 B2 * | 12/2017 | Nakamura .......... H01L 51/5256 |
| 10,193,102 B2 * | 1/2019 | Kanaya ............... H01L 51/5234 |
| 2011/0006972 A1 * | 1/2011 | Tanaka ................ H01L 27/3276 345/76 |
| 2016/0293883 A1 * | 10/2016 | Hong .................. H01L 27/3258 |

FOREIGN PATENT DOCUMENTS

JP    2016-046126 A    4/2016

* cited by examiner

*Primary Examiner* — Mary A Wilczewski
*Assistant Examiner* — Tsz K Chiu
(74) *Attorney, Agent, or Firm* — Michael Best & Friedrich LLP

(57) ABSTRACT

A display device includes a display region including light emitting elements; a first inorganic insulating layer covering the light emitting elements; a first organic insulating layer on the first inorganic insulating layer; a second organic insulating layer on the first organic insulating layer; a third organic insulating layer on the second organic insulating layer; and a second inorganic insulating layer on the third organic insulating layer. Edges of the first to third organic insulating layers are between edges of the first and second inorganic insulating layers and an edge of the display region; the edge of the second organic insulating layer is between the edge of the first organic insulating layer and the edge of the display region; and the edge of the third organic insulating layer is between the edges of the first and second inorganic insulating layers and the edge of the second organic insulating layer.

6 Claims, 18 Drawing Sheets

DISPLAY DEVICE AND MANUFACTURING METHOD THEREOF

CROSS REFERENCE TO RELATED APPLICATIONS

This application is based upon and claims the benefit of priority from the prior Japanese Patent Application No. 2016-134746, filed on Jul. 7, 2016, the entire contents of which are incorporated herein by reference.

FIELD

An embodiment according to the present invention relates to a display device, and a method for manufacturing the same.

BACKGROUND

As display devices usable for electric appliances and electronic devices, a liquid crystal display device using an electro-optical effect of a liquid crystal material and an organic EL (electroluminescence) display device including an organic electroluminescence (EL) element have been developed. Such a display device includes a display screen formed of a plurality of pixels provided on a substrate. Each of the plurality of pixels of the display device includes a liquid crystal element, an organic electroluminescence element or the like as a display element. In the display device, such pixels arrayed in a display region are driven by a pixel circuit and a driving circuit each including a transistor, and thus a signal is input and a moving image or a still image is displayed.

In the case where an organic EL element is used as the display element, a sealing layer is provided so as to cover an organic light emitting layer. For example, Japanese Laid-Open Patent Publication No. 2016-046126 discloses that such a sealing layer prevents permeation of moisture or oxygen into an organic light emitting layer.

In the meantime, a touch panel, which is a display device including a display element and a touch sensor provided on the display element, has been rapidly spread recently. Such a touch panel is now indispensable for mobile information terminals such as smartphones and the like, and is progressively developed worldwide for further improvement in the information society.

Methods for manufacturing such a touch panel are classified into two systems: one is an out-cell system, by which a touch sensor is manufactured separately from a display device and then the touch sensor and the display device are bonded together, and the other is an in-cell system, by which a touch panel is incorporated into a display device.

SUMMARY

An embodiment according to the present invention provides a display device including a display region including a plurality of light emitting elements arrayed in a matrix; a first inorganic insulating layer provided so as to cover the plurality of light emitting elements; a first organic insulating layer provided on the first inorganic insulating layer; a second organic insulating layer provided on the first organic insulating layer; a third organic insulating layer provided on the second organic insulating layer; and a second inorganic insulating layer provided on the third organic insulating layer. An edge of each of the first to third organic insulating layers is located between edges of the first inorganic insulating layer and the second inorganic insulating layer and an edge of the display region; the edge of the second organic insulating layer is located between the edge of the first organic insulating layer and the edge of the display region; the edge of the third organic insulating layer is located between the edges of the first inorganic insulating layer and the second inorganic insulating layer and the edge of the second organic insulating layer; and the edges of the first inorganic insulating layer and the second inorganic insulating layer are located outer to the edge of the display region and the edges of the first to third organic insulating layers.

DESCRIPTION OF EMBODIMENTS

Figure 1A:
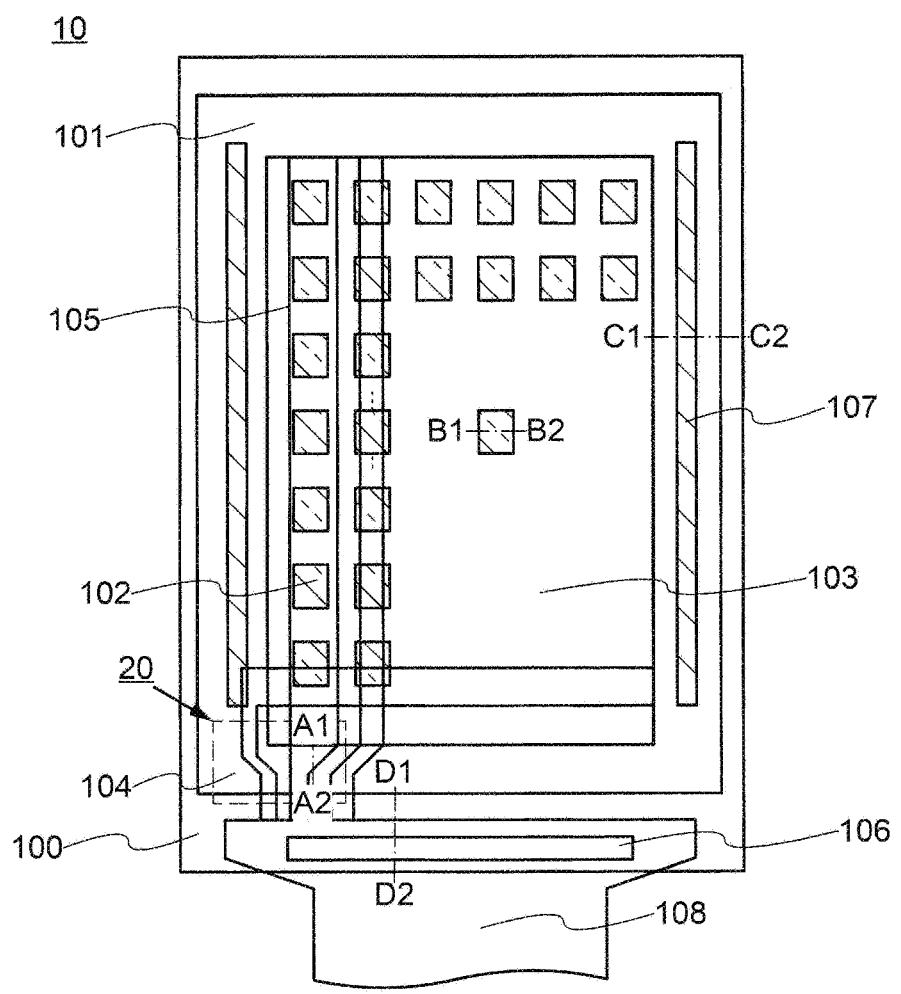
FIG. 1A is a plan view showing a structure of a display device in an embodiment according to the present invention.

Hereinafter, embodiments according to the present invention will be described with reference to the drawings. The present invention may be carried out in any of various forms and should not be construed as being limited to any of the following embodiments. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto (or identical numerals with "a", "b" or the like provided after the numerals), and detailed descriptions thereof may be omitted. The words "first", "second" or the like provided for components are used merely to distinguish the components from each other, and do not have any further meaning unless otherwise specified.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified. In the following description, the terms "above", "up" and the like refer to the side on which a second substrate is provided with respect to a substrate (substrate generally referred to as the "substrate 100"), and the terms "below", "down" and the like refer to the opposite side.

In this specification, the substrate at least includes one main surface that is planar. On the one main surface, layers including a semiconductor layer and a conductive layer, and components including a transistor and a display element, are provided. A description provided below regarding a cross-section is made with respect to the one main surface of the substrate. The terms "up", "upper layer", "above" and "upper surface" are used with respect to the one main surface of the substrate.

In this specification, the terms "film" and "layer" have substantially the same meaning, and may be used interchangeably optionally. For example, an element referred to as a "conductive layer" may also be referred to as a "conductive film".

In this specification, the expression that "A and B are connected with each other" encompasses a case where A and B are directly connected with each other physically, and also a case where A and B are electrically connected with each other. The expression that "A and B are electrically connected with each other" indicates that in the case where an item performing an electric action exists between A and B, the item allows an electric signal to be transferred between A and B.

Any other term that would be appreciated by a person of ordinary skill in the art will not be specifically explained.

In a display device including an organic EL element, a sealing layer has a higher effect as being thicker, and improves the long-term reliability of the display device. However, in the case where a line layer used for a touch sensor is formed on the organic EL element, a thick sealing layer may cause the line layer to be broken at a step provided by the sealing layer and thus may cause line disconnection.

An embodiment according to the present invention described below provides a display device including a touch panel provided on a display element with no line disconnection. An embodiment according to the present invention provides a highly reliable display device.

(Embodiment 1, Display Device Structure 1)

FIG. 1A is a plan view of a display device 10.

Figure 12:
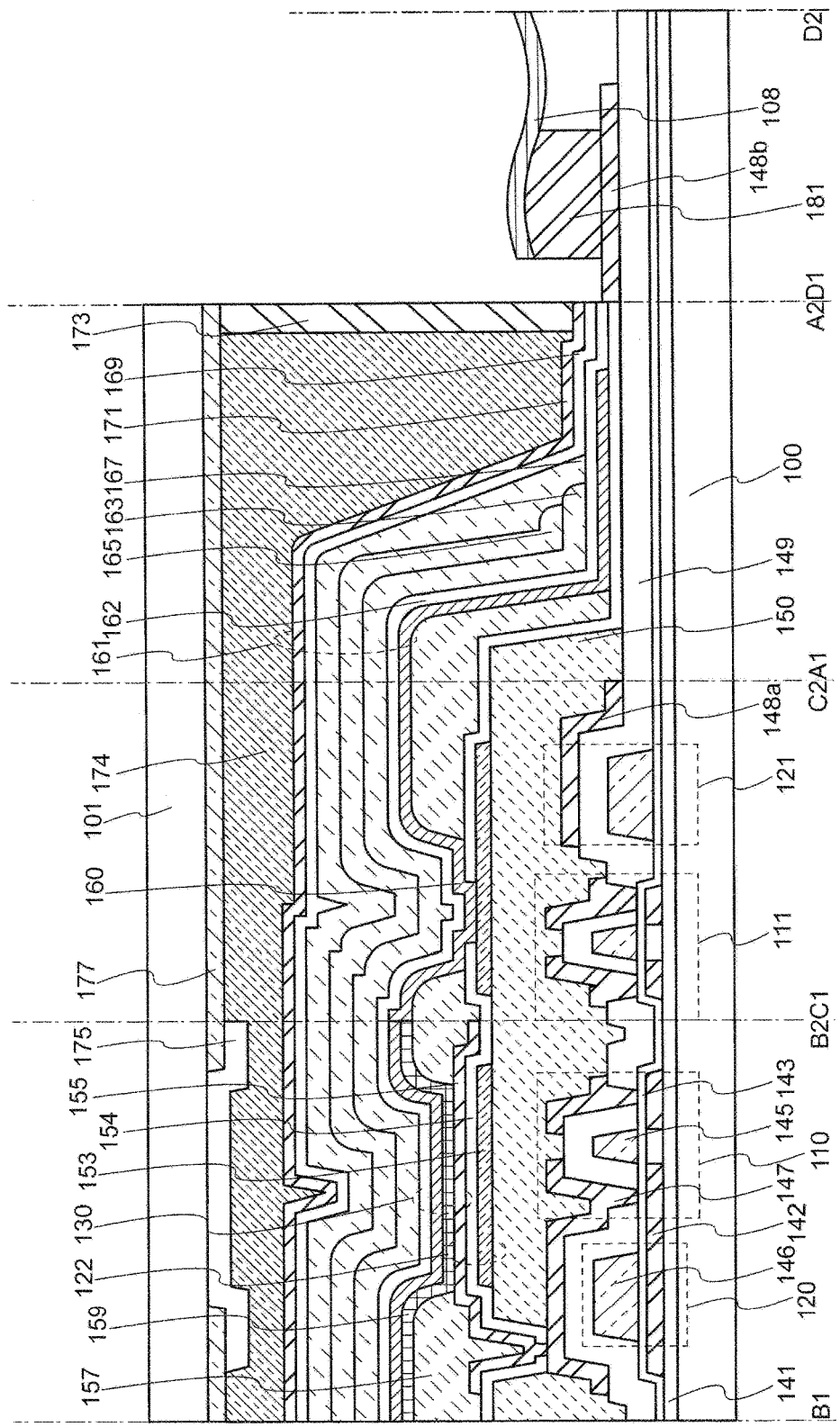
FIG. 12 is a cross-sectional view showing a structure of the display device in an embodiment according to the present invention.

As shown in FIG. 1A, the display device 10 includes a substrate 100, a substrate 101, a display region 103 including pixel 102, a peripheral region 104, a touch sensor 105, a driving circuit 106 having a function of a source driver, a driving circuit 107 having a function of a gate driver, and a flexible printed circuit board 108. As shown in FIG. 1A, the pixel 102 are arrayed in a matrix, and lines for the touch panel 105 extend in a row direction and a column direction. Further, as shown in FIG. 12 or the like, the pixel 102 includes a display element 130. Therefore, a plurality of display elements 130 are also arranged in a matrix.

In the display device 10, the display region 103, the driving circuit 106, the driving circuit 107, and the flexible printed circuit board 108 are electrically connected with each other. A signal is input from an external device, and a still image or a moving image is displayed. The touch sensor 105 is electrically connected with the flexible printed circuit board 108. Information is input and output by, for example, an electrostatic capacitance system, which uses a change in the inter-line capacitance at the time of contacting the touch sensor 105.

The structure, method or the like described in embodiment 1 may be appropriately combined with a structure, method or the like shown in any other embodiment.

(Embodiment 2, Structure of the Peripheral Region of the Display Device)

Figure 1B:
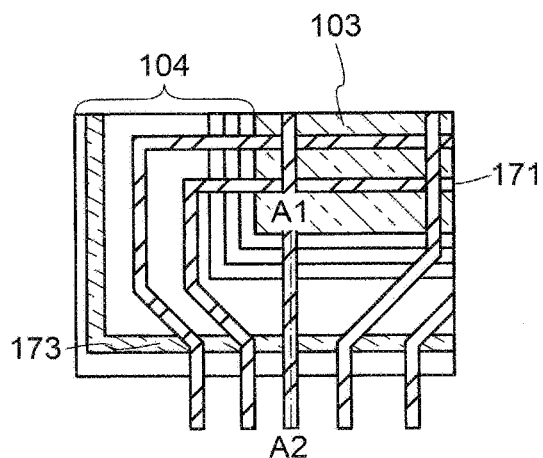
FIG. 1B is a plan view showing a structure of a part of the display device in an embodiment according to the present invention.

FIG. 1B is an enlarged view of a region 20 in the display device 10 shown in FIG. 1A. The region 20 includes a part of the display region 103, a part of the peripheral region 104, a part of a conductive layer 171, and a part of a sealing member 173. In the display device 10, the peripheral region 104 is outer to an edge of the display region 103.

Figure 1C:
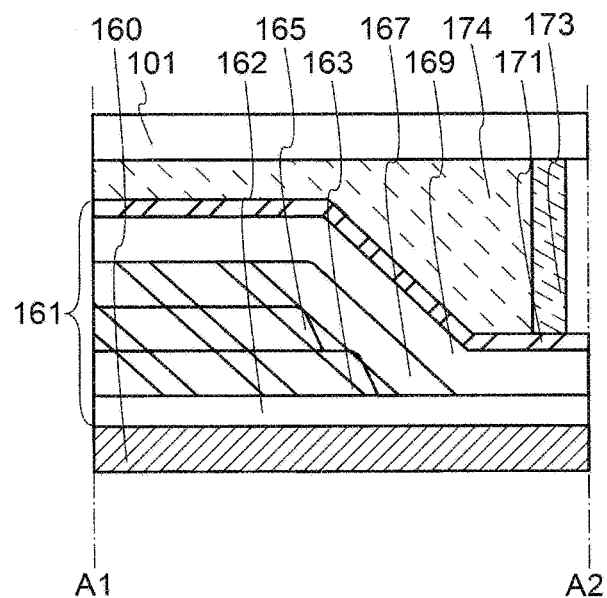
FIG. 1C is a cross-sectional view showing a structure of the display device in an embodiment according to the present invention.

FIG. 1C is a cross-sectional view taken along line A1-A2 in FIG. 1B. As shown in FIG. 1C, the peripheral region 104 includes a conductive layer 160, a sealing layer 161, the conductive layer 171, the sealing member 173, a filling member 174, and the substrate 101. The conductive layer 160 is usable as an electrode of a light emitting element 130 included in the display region 103. The substrate 100 and the substrate 101 may be secured to each other by the sealing member 173 so as to provide a hollow structure without the filling member 174. Alternatively, in the case where the substrate 100 and the substrate 101 may be secured to each other by the filling member 174, the sealing member 173 may be omitted.

The sealing layer 161 includes an inorganic sealing layer 162, an organic sealing layer 163, an organic sealing layer 165, an organic sealing layer 167, and an inorganic sealing layer 169. The sealing layer 161 has a function of preventing permeation of moisture or oxygen into a light emitting element such as an organic EL layer or the like. The sealing layer 161 is provided so as to cover the display region 103.

The inorganic sealing layer 162 and the inorganic sealing layer 169 may each be formed of an insulating film containing at least one of aluminum oxide, magnesium oxide, silicon oxide, silicon oxide nitride, silicon nitride oxide, silicon nitride, gallium oxide, zirconium oxide, lanthanum oxide, neodymium oxide, hafnium oxide and tantalum oxide. The inorganic sealing layer 162 and the inorganic sealing layer 169 may each have a thickness of several ten nanometers to several micrometers.

The organic sealing layer 163, the organic sealing layer 165 and the organic sealing layer 167 may each be formed of acrylic resin, polyimide resin, epoxy resin or the like. The organic sealing layer 163, the organic sealing layer 165 and the organic sealing layer 167 may each have a thickness of several micrometers to several ten micrometers.

The sealing layer 161 has the following structure. The organic sealing layer 163 is provided on the inorganic sealing layer 162. The organic sealing layer 165 is provided on the organic sealing layer 163. The organic sealing layer 167 is provided on the inorganic sealing layer 162, the organic sealing layer 163 and the organic sealing layer 165. The inorganic sealing layer 169 is provided on the inorganic sealing layer 162 and the organic sealing layer 167.

Edges of the organic sealing layer 163, the organic sealing layer 165 and the organic sealing layer 167 are located between edges of the inorganic sealing layer 162 and the inorganic sealing layer 169 and an edge of the display region 103.

The edge of the organic sealing layer 165 is located between the edge of the display region 103 and the edge of the organic sealing layer 163. The edge of the organic sealing layer 167 is located between the edges of the inorganic sealing layer 162 and the inorganic sealing layer 169 and the edge of the organic sealing layer 163.

The edges of the inorganic sealing layer 162 and the inorganic sealing layer 169 are located outer to any of the edges of the display region 103, the organic sealing layer 163, the organic sealing layer 165 and the organic sealing layer 167.

With the above-described structure, the inorganic sealing layer 162 and the inorganic sealing layer 169 are in contact with each other. This prevents the edges of the organic sealing layer 163, the organic sealing layer 165 and the organic sealing layer 167 from being exposed outside. There are a plurality of the inorganic sealing layers. Therefore, even if a defect such as a pin hole or the like is formed in a part of the inorganic sealing layers, the other inorganic sealing layers compensate for the defect and thus permeation of moisture is suppressed more effectively.

Figure 2A:
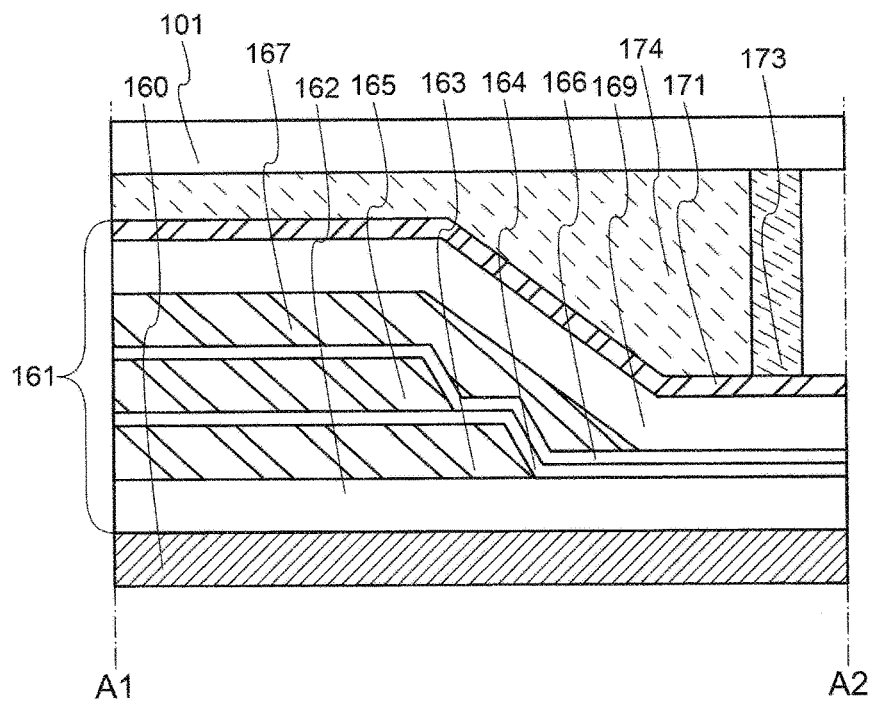
FIG. 2A and FIG. 2B are each a cross-sectional view showing a structure of the display device in an embodiment according to the present invention.
Figure 2B:
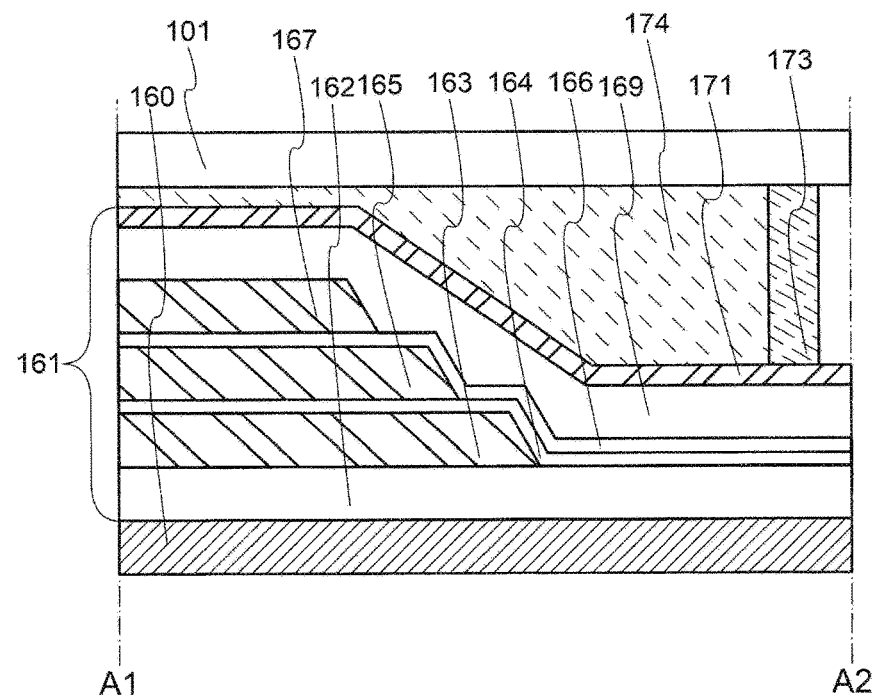

As shown in FIG. 2A, the sealing layer 161 may further include an inorganic sealing layer 164 provided between the organic sealing layer 163 and the organic sealing layer 165, and include an inorganic sealing layer 166 provided between the organic sealing layer 165 and the organic sealing layer 167. In this case, as shown in FIG. 2B, the edge of the organic sealing layer 167 may be provided between the edge of the display region 103 and the edge of the organic sealing layer 165.

Figure 3A:
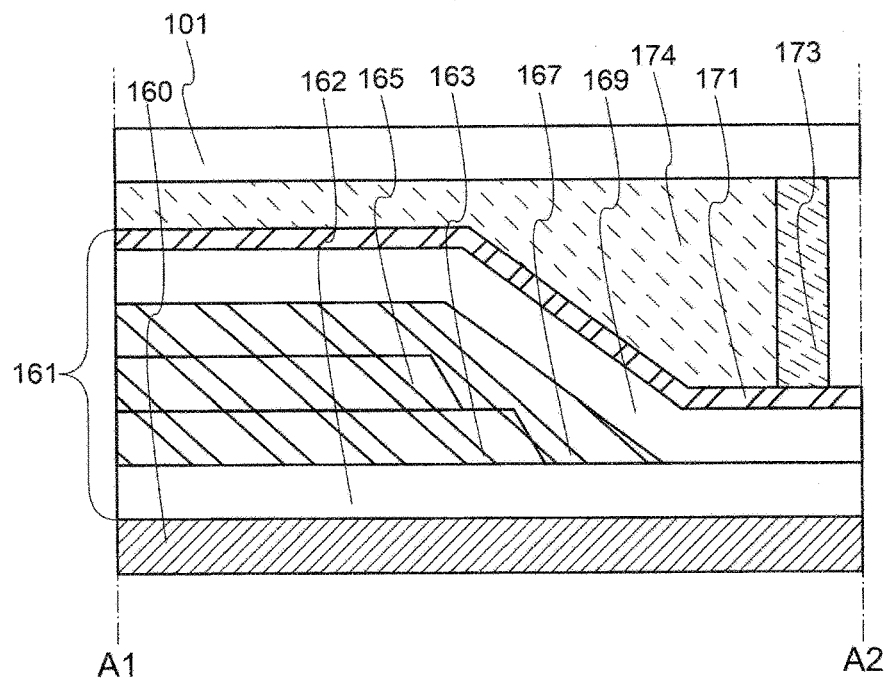
FIG. 3A is a cross-sectional view showing a structure of the display device in an embodiment according to the present invention.
Figure 3B:
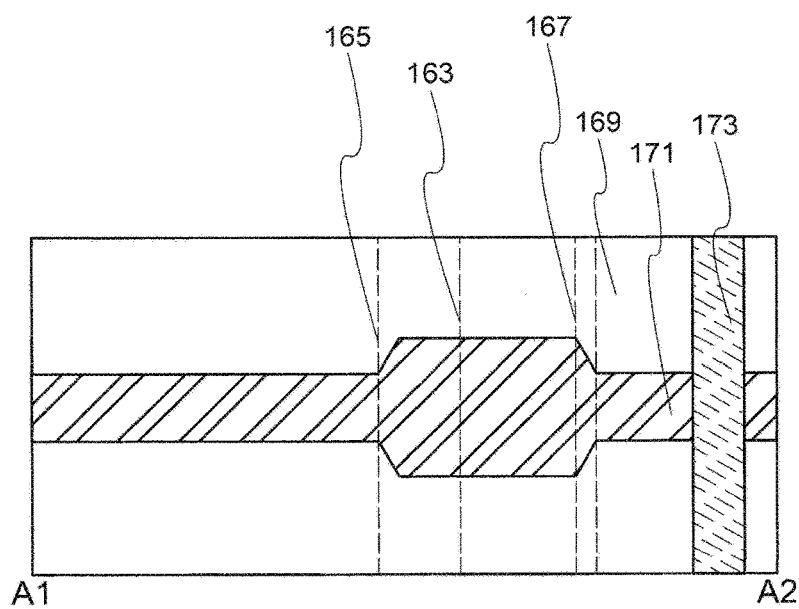
FIG. 3B is a plan view showing a structure of the display device in an embodiment according to the present invention.
Figure 4A:
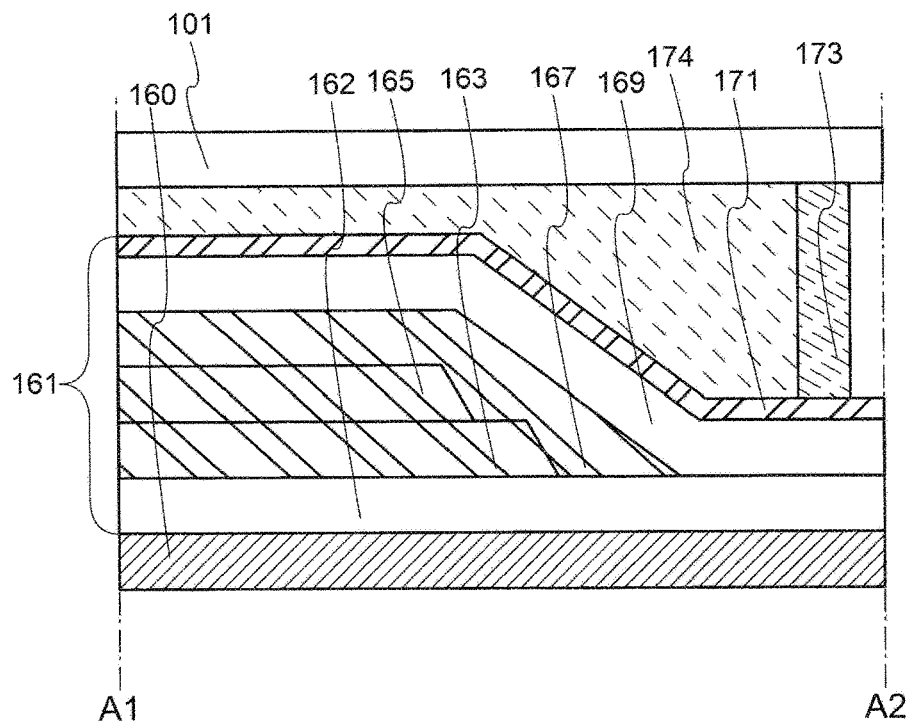
FIG. 4A is a cross-sectional view showing a structure of the display device in an embodiment according to the present invention.
Figure 4B:
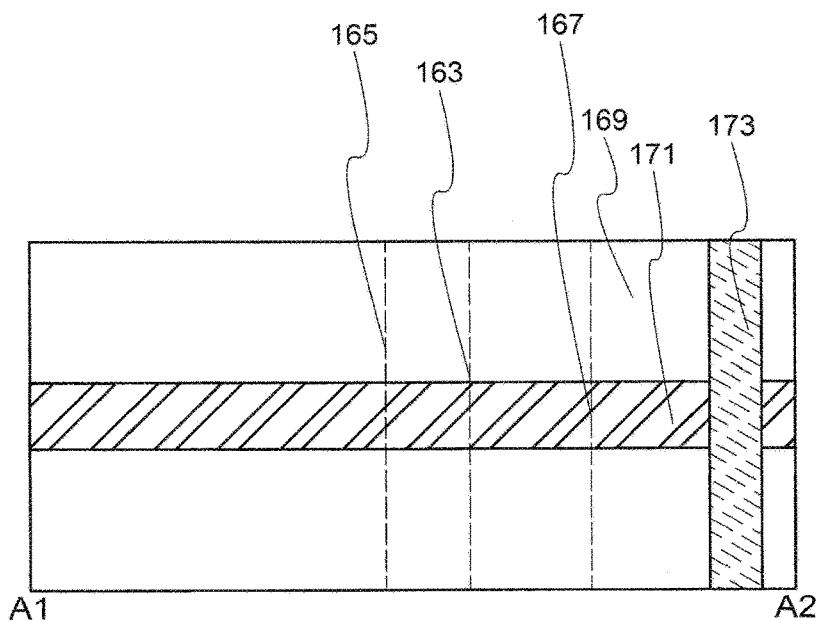
FIG. 4B is a plan view showing a structure of the display device in an embodiment according to the present invention.

FIG. 3A and FIG. 4A are each a cross-sectional view of the display device 10 taken along line A1-A2 shown in FIG. 1B. FIG. 3A and FIG. 4B are each a plan view of the display device 10 in an area corresponding to the edges of the organic sealing layer 163, the organic sealing layer 165 and the organic sealing layer 167 and the vicinity thereof. The conductive layer 171 may be wider in an area thereof overlapping the edges of the organic sealing layer 163, the organic sealing layer 165 and the organic sealing layer 167 than in the remaining area. Alternatively, as shown in FIG. 4B, the conductive layer 171 may have a linear shape.

As seen in the cross-sectional view taken along line A1-A2, it is preferable that the edges of the organic sealing layer 163, the organic sealing layer 165 and the organic sealing layer 167 are tapered, namely, inclined.

As seen in the cross-sectional view taken along line A1-A2, it is preferable that the edges of the organic sealing layer 163, the organic sealing layer 165 and the organic sealing layer 167 each have a rounded corner as shown in, for example, FIG. 12.

The above-described structure allows the conductive layer 160 to be provided stably with no line disconnection.
(Embodiment 3, Method for Manufacturing the Peripheral Region of the Display Device)

Hereinafter, a method for manufacturing the display device in an embodiment according to the present invention with reference to FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A and FIG. 11B. The display device manufactured by the following method corresponds to the display device 10 shown in FIG. 1A, FIG. 1B, FIG. 1C, FIG. 2A, FIG. 2B, FIG. 3A, FIG. 3B, FIG. 4A and FIG. 4B. FIG. 5A, FIG. 6A, FIG. 7A, FIG. 8A, FIG. 9A, FIG. 10A and FIG. 11A are each a cross-sectional view showing each of steps of the method for manufacturing the display device 10. FIG. 5B, FIG. 6B, FIG. 7B, FIG. 8B, FIG. 9B, FIG. 10B and FIG. 11B are each a plan view showing each of the steps of the method for manufacturing the display device 10.

Figure 5A:
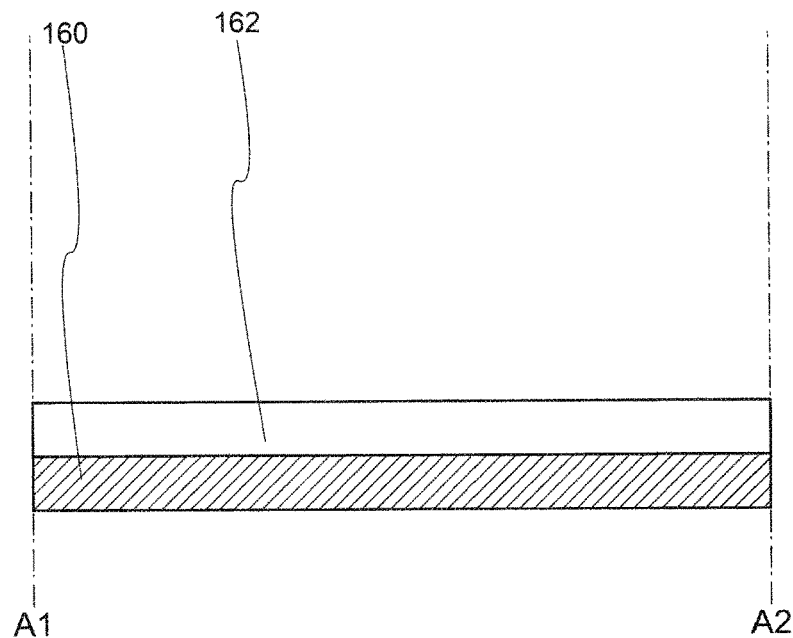
FIG. 5A is a cross-sectional view showing a method for manufacturing the display device in an embodiment according to the present invention.
Figure 5B:
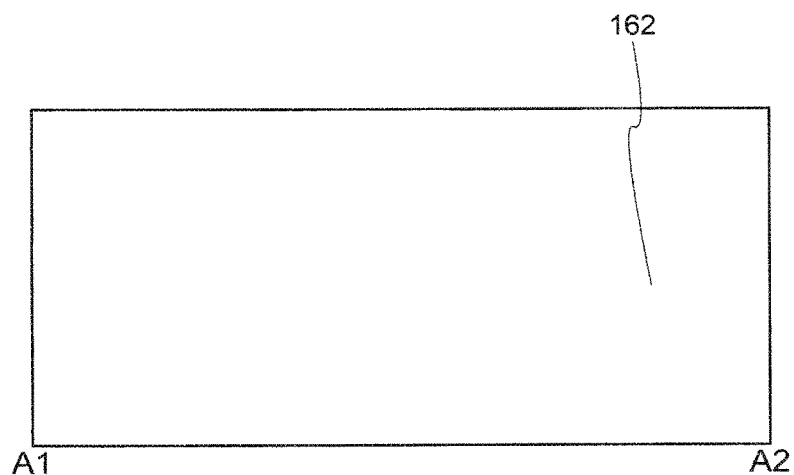
FIG. 5B is a plan view showing the method for manufacturing the display device in an embodiment according to the present invention.

On the conductive 160, the inorganic sealing layer 162 is formed (see FIG. 5A and FIG. 5B). In this step, it is preferable that the inorganic sealing layer 162 is formed so as to cover the display region 103. The inorganic sealing layer 162 may be formed by plasma CVD, thermal CVD, vapor deposition, spin-coating, spraying or printing. For example, the inorganic sealing layer 162 may be formed of a silicon nitride film by plasma CVD.

Figure 6A:
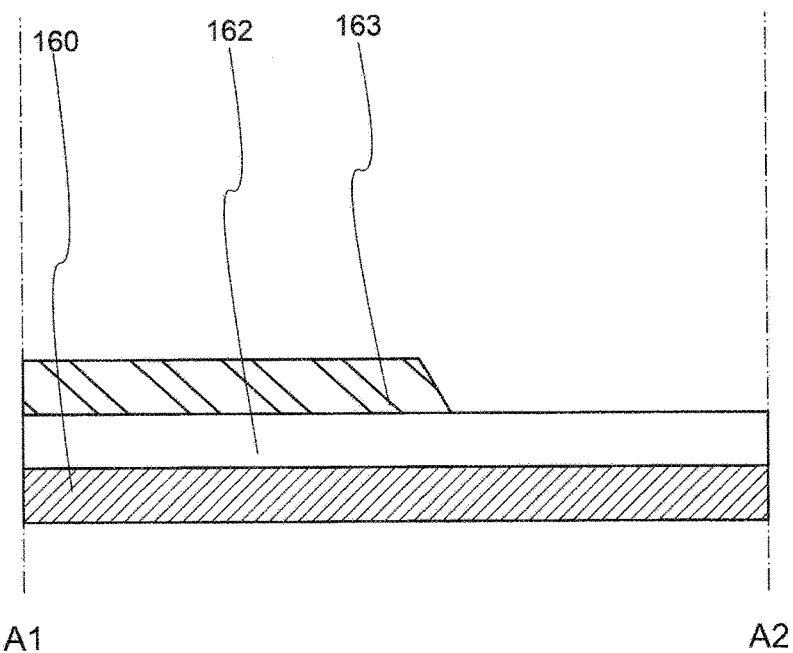
FIG. 6A is a cross-sectional view showing the method for manufacturing the display device in an embodiment according to the present invention.
Figure 6B:
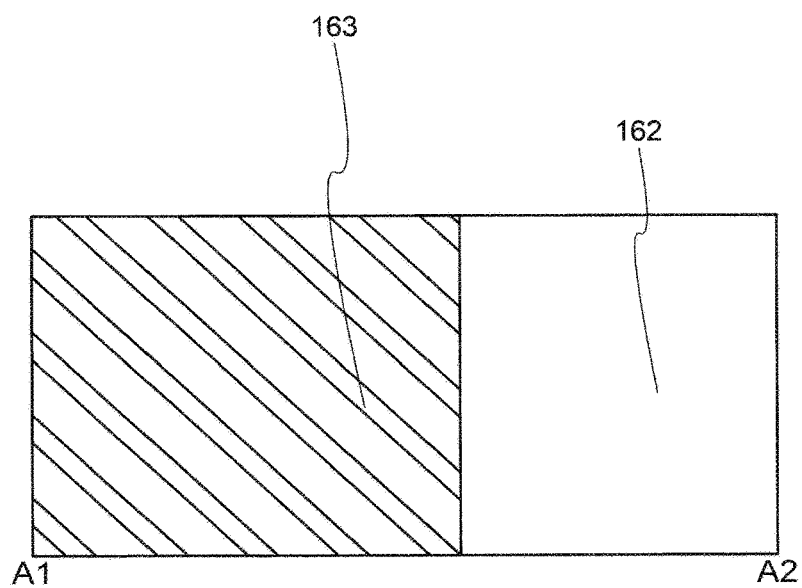
FIG. 6B is a plan view showing the method for manufacturing the display device in an embodiment according to the present invention.

Next, the organic sealing layer 163 is formed on the inorganic sealing layer 162 (see FIG. 6A and FIG. 6B). An organic layer to be the organic sealing layer 163 is formed by spin-coating, vapor deposition, spraying, ink-jetting, printing or the like to a thickness of about several micrometers to about several ten micrometers, and then is processed by, for example, photolithography and dry etching. Thus, the organic sealing layer 163 is formed. It is preferable that the organic sealing layer 163 is formed such that the edge thereof is located between the edge of the display region 103 and the edge of the inorganic sealing layer 162. The method for forming the organic sealing layer or the method for processing the organic sealing layer is not limited to the above and may be optionally changed.

Figure 7A:
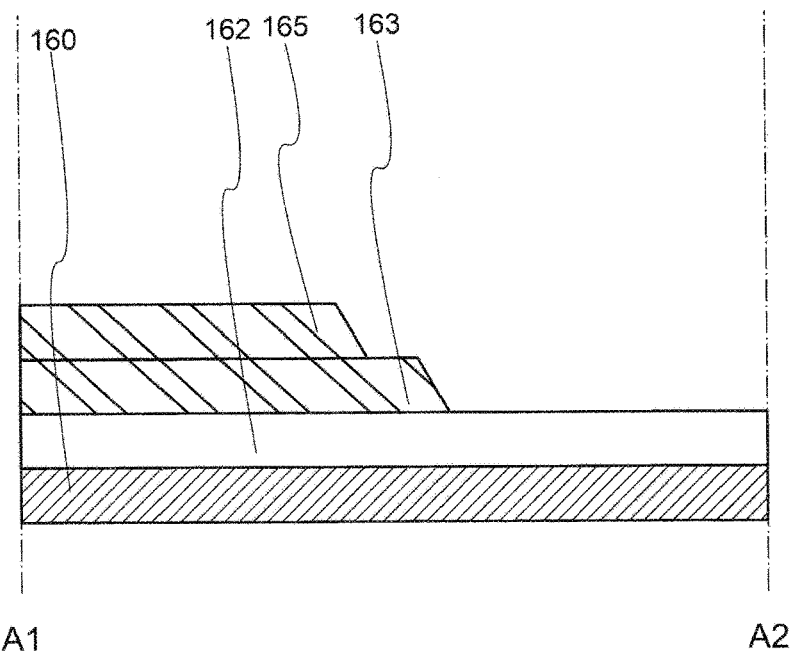
FIG. 7A is a cross-sectional view showing the method for manufacturing the display device in an embodiment according to the present invention.
Figure 7B:
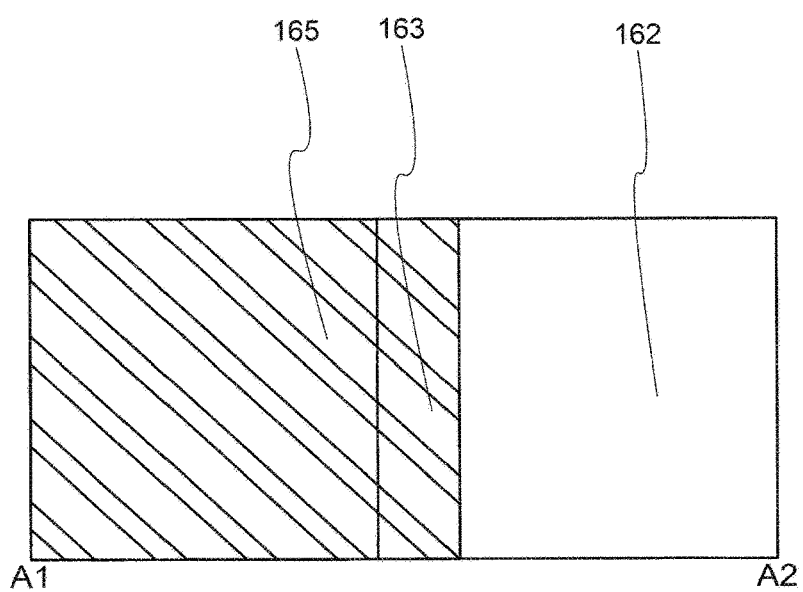
FIG. 7B is a plan view showing the method for manufacturing the display device in an embodiment according to the present invention.

Next, the organic sealing layer 165 is formed on the organic sealing layer 163 (see FIG. 7A and FIG. 7B). The organic sealing layer 165 is formed in substantially the same method as that of the organic sealing layer 163. It is preferable that the organic sealing layer 165 is formed such that the edge thereof is located between the edge of the organic sealing layer 163 and the edge of the display region 103.

Figure 8A:
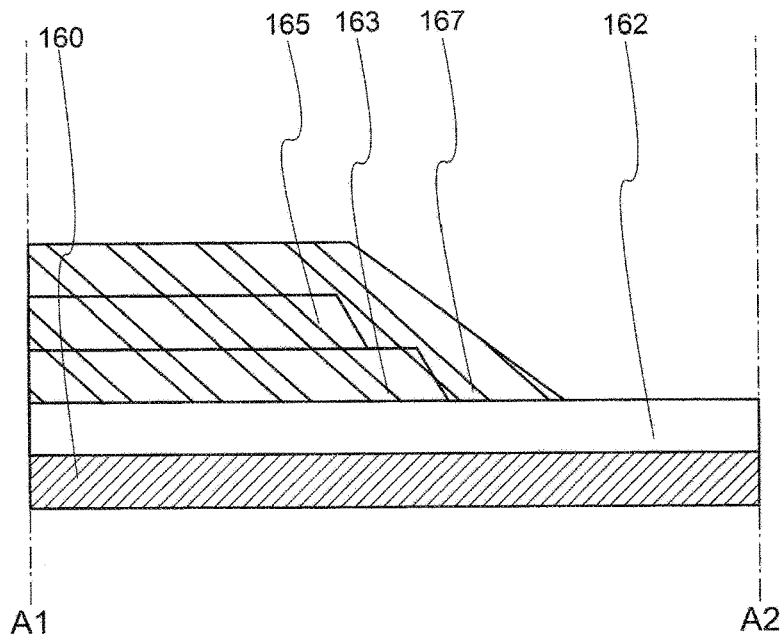
FIG. 8A is a cross-sectional view showing the method for manufacturing the display device in an embodiment according to the present invention.
Figure 8B:
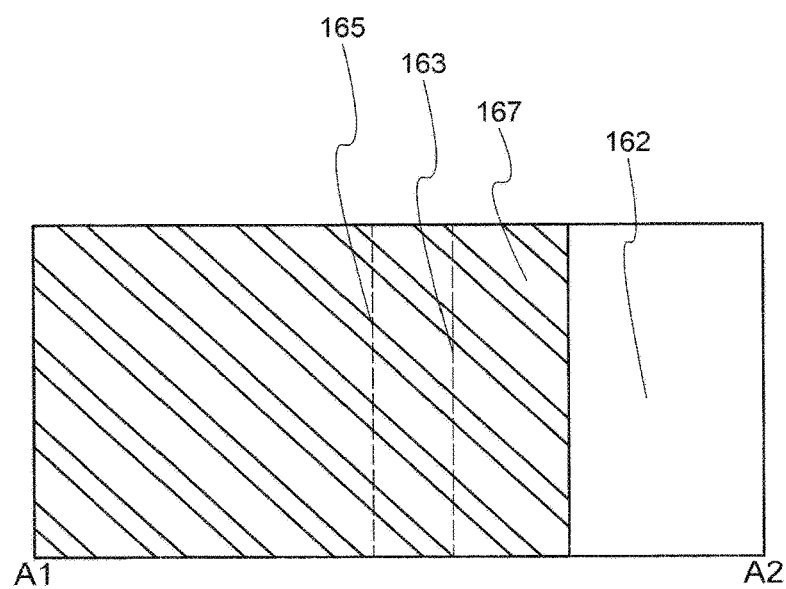
FIG. 8B is a plan view showing the method for manufacturing the display device in an embodiment according to the present invention.

Next, the organic sealing layer 167 is formed on the organic sealing layer 165, the organic sealing layer 163 and the inorganic sealing layer 162 (see FIG. 8A and FIG. 8B). The organic sealing layer 167 is formed in substantially the same method as that of the organic sealing layer 163. It is preferable that the organic sealing layer 167 is formed such that the edge thereof is located between the edge of the organic sealing layer 163 and the edge of the inorganic sealing layer 162.

Figure 9A:
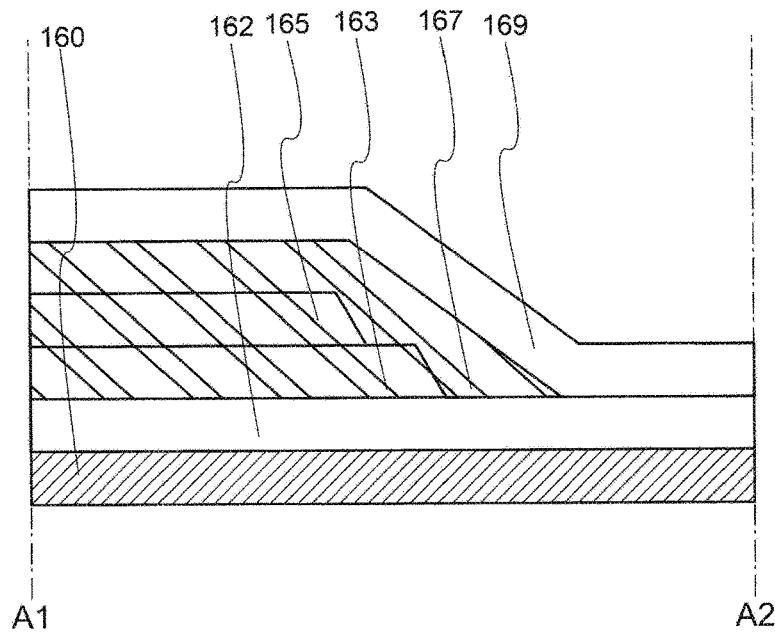
FIG. 9A is a cross-sectional view showing the method for manufacturing the display device in an embodiment according to the present invention.
Figure 9B:
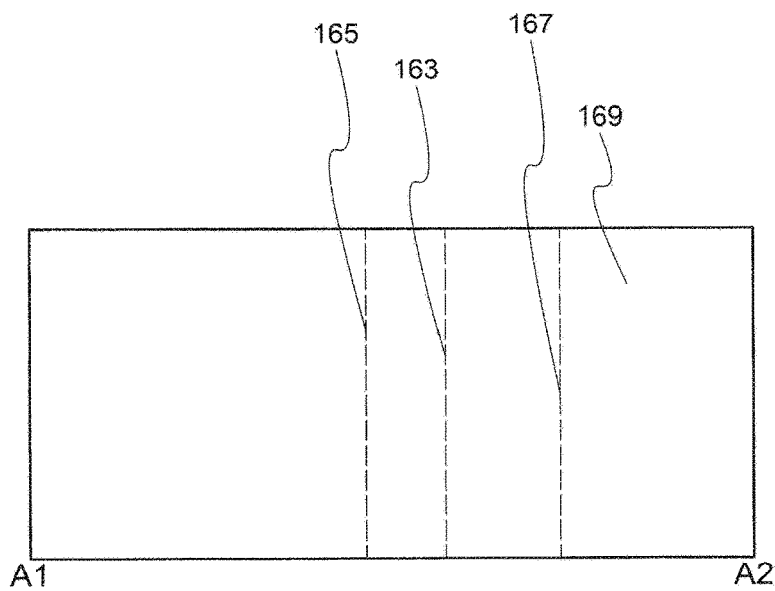
FIG. 9B is a plan view showing the method for manufacturing the display device in an embodiment according to the present invention.

Next, the inorganic sealing layer 169 is formed on the organic sealing layer 167 and the inorganic sealing layer 162 (see FIG. 9A and FIG. 9B). The inorganic sealing layer 169 may be formed in substantially the same method as that of the inorganic sealing layer 162. The edges of the inorganic sealing layer 162 and the inorganic sealing layer 169 are located outer to any of the edges of the display region 103, the organic sealing layer 163, the organic sealing layer 165 and the organic sealing layer 167. Such an arrangement of the inorganic sealing layer 162 and the inorganic sealing layer 169 may be realized by use of a mask or with no use of a mask.

The inorganic sealing layer 164 may be formed after the organic sealing layer 163 is formed but before the organic sealing layer 165 is formed. The inorganic sealing layer 166 may be formed after the organic sealing layer 165 is formed but before the organic sealing layer 167 is formed.

Next, a conductive layer 170, which is to be the conductive layer 171, is formed on the inorganic sealing layer 169. The conductive layer 170 may be formed by sputtering, CVD, vapor deposition or the like.

Figure 10A:
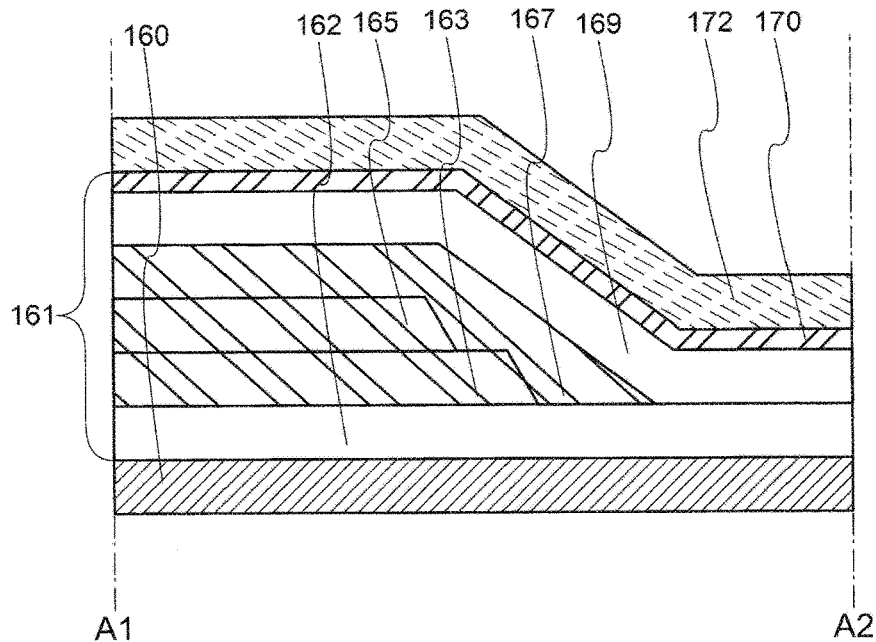
FIG. 10A is a cross-sectional view showing the method for manufacturing the display device in an embodiment according to the present invention.
Figure 10B:
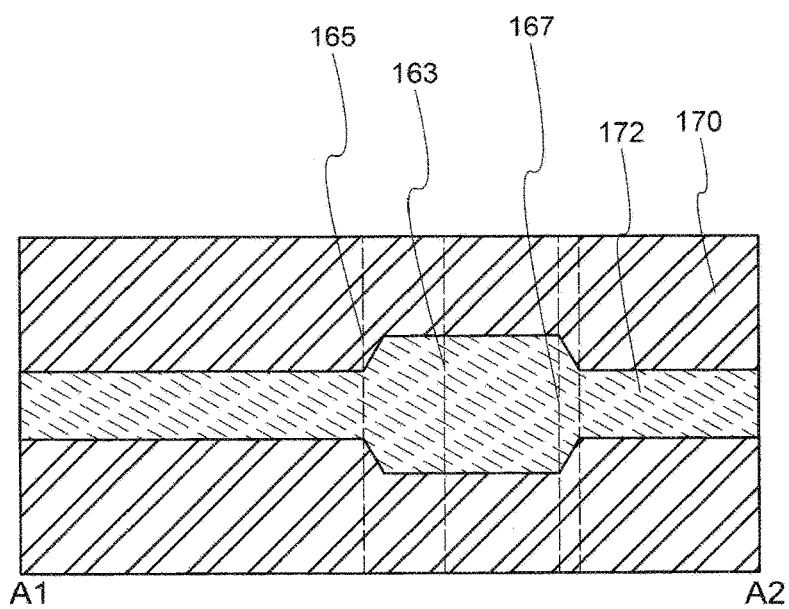
FIG. 10B is a plan view showing the method for manufacturing the display device in an embodiment according to the present invention.

Next, a photoresist 172 is formed on the conductive layer 170 (see FIG. 10A and FIG. 10B). It is preferable that as shown in FIG. 10B, the photoresist 172 is formed to be wider in the area thereof overlapping the edges of the organic sealing layer 163, the organic sealing layer 165 and the organic sealing layer 167 than in the remaining area. The area of the photoresist 172 overlapping the edges of the organic sealing layer 163, the organic sealing layer 165 and the organic sealing layer 167 may be as wide as the remaining area. It is preferable that the width of the photoresist 172 in the area corresponding to the edges is equal to or more than, and at most twice, the width of the photoresist 172 in the remaining area.

Next, the conductive layer 170 is dry-etched to form the conductive layer 171. The conductive layer 170 is likely to be etched more than necessary in an area thereof overlapping steps provided by the edges of the organic sealing layer 163, the organic sealing layer 165 and the organic sealing layer 167 because the photoresist 172 is thinner in this area. The photoresist 172 is formed to be wider in this area as described above, so that the width of the post-etching conductive layer 170 is not smaller in this area than in the remaining area. Regarding the photoresist 172 having such a wider area, it is not necessary to control the shape of the photoresist 172 precisely. It is sufficient that the photoresist 172 has a sufficient width after the etching and is not short-circuited with the other lines. It causes no problem even if the post-etching conductive layer 170 is still wider or is slightly thinner in this area than in the remaining area.

Figure 11A:
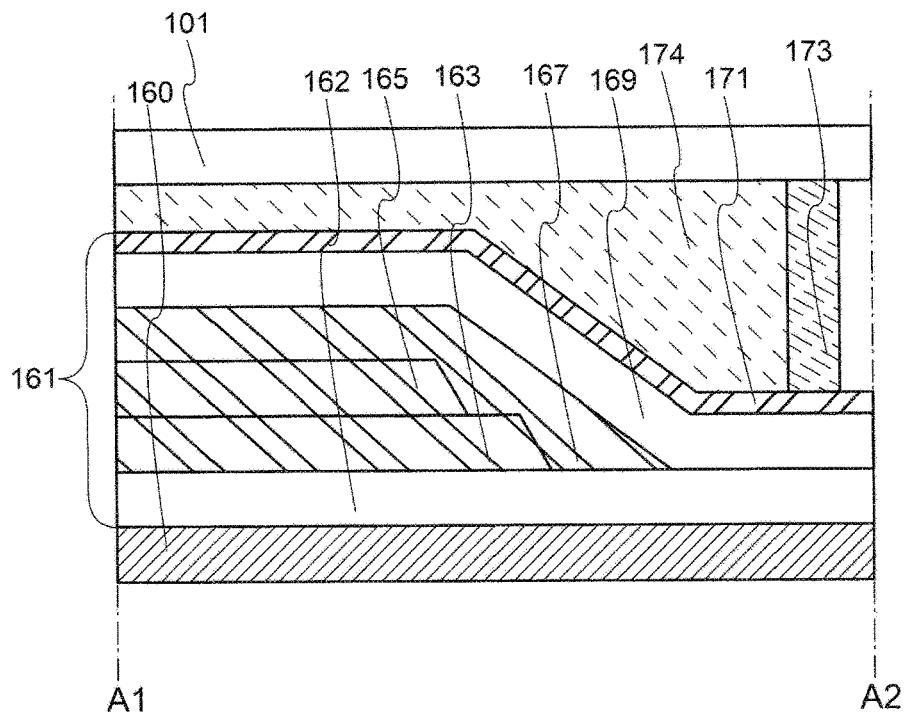
FIG. 11A is a cross-sectional view showing the method for manufacturing the display device in an embodiment according to the present invention.
Figure 11B:
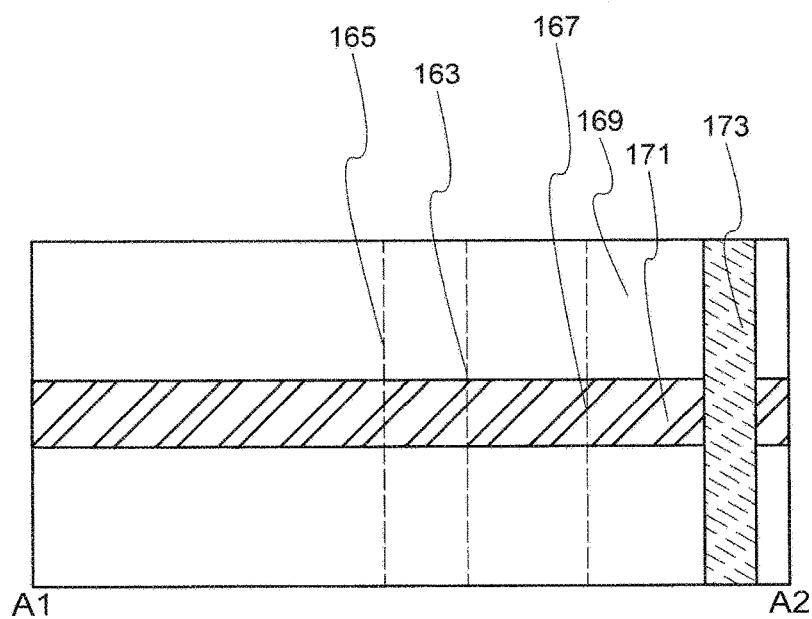
FIG. 11B is a plan view showing the method for manufacturing the display device in an embodiment according to the present invention.

Next, the sealing member 173 and the filling member 174 are formed (see FIG. 11A and FIG. 11B). The sealing member 173 and the filling member 174 may be formed by spin-coating, vapor deposition, spraying, ink-jetting, printing or the like.

The above-described manufacturing method allows the display device 10 to be manufactured stably with a higher level of sealing property without breaking the lines for the touch sensor.

The structure, method or the like described in embodiment 3 may be appropriately combined with a structure, method or the like shown in any other embodiment.

(Embodiment 4, Display Device Structure 2)

Hereinafter, a structure including the other components of the display device 10 will be described with reference to the drawings.

Figure 13:
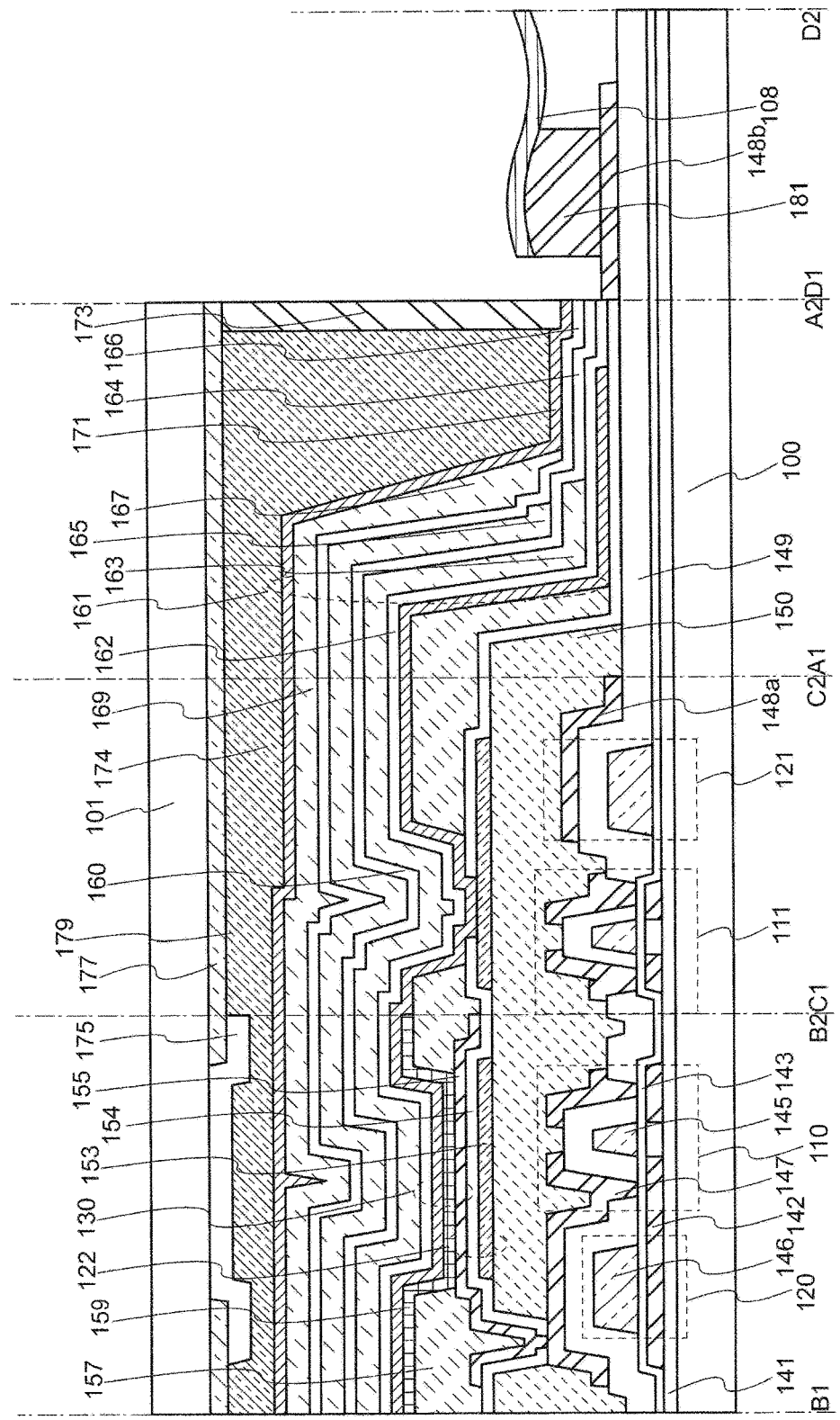
FIG. 13 is a cross-sectional view showing a structure of the display device in an embodiment according to the present invention.

FIG. 12 is a cross-sectional view of the display device 10. More specifically, FIG. 12 shows a cross-section of the peripheral region 104 taken along line A1-A2 in FIG. 1A, a cross-section of a pixel region including one pixel 102 taken along line B1-B2 in FIG. 1A, a cross-section of a driving circuit region including the driving circuit 107 taken along line C1-C2 in FIG. 1A, and a cross-section of a terminal region including the driving circuit 106 taken along line D1-D2 in FIG. 1A. FIG. 12 shows the structure of the display device 10 in the case where the sealing layer 161 has the structure shown in FIG. 1B. FIG. 13 shows the structure of the display device 10 in the case where the sealing layer 161 has the structure shown in FIG. 2A. (Hereinafter, the peripheral region 104 may be referred to as the "peripheral region A1-A2 region", the pixel region may be referred to as the "pixel region B1-B2", the driving circuit region may be referred to as the "driving circuit region C1-C2", and the terminal region may be referred to as the "terminal region D1-D2".)

A transistor 110 and a transistor 111 each include a semiconductor layer 142, a gate insulating layer 143, a gate electrode layer 145, a source/drain electrode layer 147, and the like. In FIG. 12, the transistors 110 and 111 each have a top gate/top contact structure. The transistors 110 and 111 are not limited to having such a structure, and may each have a bottom gate structure or a bottom contact structure. In the case where the transistors 110 and 111 each have both of an n channel and a p channel, the transistors 110 and 111 may each have a CMOS structure so as to increase the degree of integration and also realize low power consumption.

The substrates 100 and 101 are formed of glass or an organic resin material. A usable organic resin material is, for example, polyimide. The substrates 100 and 101, when being formed of an organic resin material, may each have a thickness of several micrometers to several ten micrometers, so that the display device 10 is a flexible sheet display. The substrate 100 or 101 needs to be transparent in order to allow light emitted by a light emitting element (described below) to be output outside the display device 10. A substrate on the side from which light is not output does not need to be transparent, and therefore, may be formed of a metal substrate and an insulating film formed on a surface of the metal substrate, instead of being formed of the above-described material. The display device 10 may include a glass cover, a protective film or the like provided on each of second surfaces of the substrates 100 and 101 (namely, outer surfaces of the substrates 100 and 101 as seen in a cross-sectional view). The glass cover, the protective film or the like protects the display device 10 against scratches, breakage or the like. The substrate 101 has a role of protecting the light emitting element (described below), but does not need to have such a function if the sealing layer 161 sufficiently protects the light emitting element.

An insulating layer 141 acts as an underlying layer. The insulating layer 141 may be formed of silicon oxide, silicon oxide nitride, silicon nitride, silicon nitride oxide, gallium oxide, hafnium oxide, yttrium oxide, aluminum oxide, aluminum oxide nitride, or the like. The insulating layer 141 may be a single layer or may be a stack of a plurality of layers. The insulating layer 141 may be formed of any of the above-described materials, so as to suppress impurities, typically, an alkaline metal material, water, hydrogen or the like from being diffused from the substrate 100 into the semiconductor layer 142.

The semiconductor layer 142 may be formed of silicon, silicon germanium, an oxide semiconductor, an organic semiconductor or the like. Examples of usable type of silicon include amorphous silicon, microcrystalline silicon, polycrystalline silicon, single crystalline silicon, and the like. Usable as an oxide semiconductor is at least one metal material among indium, gallium, zinc, titanium, aluminum, tin, hafnium, neodymium, zirconium, lanthanum, cerium and yttrium. The semiconductor layer 142 may be formed of an oxide semiconductor containing indium, gallium and zinc (IGZO).

The gate insulating layer 143 may be formed of an insulating material containing at least one of aluminum oxide, magnesium oxide, silicon oxide, silicon oxide nitride, silicon nitride oxide, silicon nitride, gallium oxide, zirconium oxide, lanthanum oxide, neodymium oxide, hafnium oxide and tantalum oxide.

The insulating layer 149 and an insulating layer 154 may each be formed of any of the above-described materials usable for the gate insulating layer 143. The insulating layer 149 and the insulating layer 154 may each be a single layer or may be a stack of a plurality of layers.

The gate insulating layer 145 and the source/drain electrode layer 147 may each be formed of a metal element selected from tungsten, aluminum, chromium, copper, titanium, tantalum, molybdenum, nickel, iron, cobalt, indium and zinc, an alloy containing any of the above-listed metal materials as one component, an alloy obtained as a result of combining any of the above-listed metal materials, or the like. The gate electrode layer 145 and the source/drain electrode layer 147 may each contain nitrogen, oxygen, hydrogen or the like. The gate insulating layer 145 and the source/drain electrode layer 147 may each be a stack of any of the above-listed materials.

An insulating layer 150 acts as a planarization film. The insulating layer 150 may be formed of an organic insulating material, an inorganic insulating material, or an insulating material containing an organic insulating material and an inorganic insulating material in a stacking manner. The insulating layer 150 may be formed of, for example, a film containing silicon oxide, silicon nitride or the like, a polymer material such as acrylic resin, polyester, polyamide, polyimide, polysiloxane or the like, or a photosensitive resin.

A conductive layer 153 may be formed of any of substantially the same materials as those usable for the gate electrode layer 145 and the source/drain electrode layer 147.

A capacitance element 120 may be provided in a region where a source or drain region of the semiconductor layer 142, and a capacitance electrode layer 146 formed of any of substantially the same materials as those usable for the gate electrode layer 145, overlap each other while having the gate insulating layer 143 acting as a dielectric layer therebetween. A capacitance element 121 may be provided in a region where the capacitance electrode layer 146 and a capacitor electrode layer 148a, which is formed of any of substantially the same materials as those usable for the source/drain electrode layer 147, overlap each other while having the insulating layer 149 acting as a dielectric layer therebetween. A capacitance element 122 may be provided in a region where the conductive layer 153 and a conductive layer 155 overlap each other while having the insulating layer 154 acting as a dielectric layer therebetween.

The light emitting element 130 may include the conductive layer 155, an organic EL layer 159 and the conductive layer 160. In an embodiment according to the present invention, the light emitting element 130 has a so-called top emission structure, in which light emitted by the organic EL layer 159 is output toward the conductive layer 160. The light emitting element 130 is not limited to having a top emission structure, and may have a bottom emission structure.

The organic EL layer 159 contains a light emitting material such as an organic electroluminescence material or the like. The organic EL layer 159 may be formed of a low molecular weight-type or high molecular weight-type organic material. In the case of being formed of a low molecular weight-type material, the organic EL layer 159 may include a light emitting layer containing a light emitting organic material and also include a hole injection layer and an electron injection layer or may further include a hole transfer layer and an electron transfer layer. The hole injection layer and the electron injection layer, or the hole transfer layer and the electron transfer layer, when being included, are provided so as to have the light emitting layer therebetween. For example, the organic EL layer 159 may have a structure in which the light emitting layer is held between the hole injection layer and the electron injection layer. The organic EL layer 159 may further include the hole transfer layer, the electron transfer layer, a hole block layer, an electron block layer and the like as necessary, in addition to the hole injection layer and the electron injection layer.

The conductive layer 155 preferably has a function of a pixel electrode and also has a light reflecting property. The conductive layer 155 may be formed of, for example, a light reflective metal material such as aluminum (Al), silver (Ag) or the like. Alternatively, the conductive layer 155 may have a structure including a transparent conductive layer formed of ITO (indium tin oxide; tin oxide-containing indium oxide) or IZO (indium zinc oxide; indium oxide-zinc oxide) and a light reflective metal layer in a stacking manner.

The conductive layer 160 may be formed of a transparent conductive film such as ITO, IZO or the like, which is light transmissive so as to allow light emitted in the organic EL layer 159 to be transmitted through the conductive layer 160, and is also conductive.

The conductive layer 171 has a function of a line for the touch sensor. The conductive layer 171 may be formed of any of substantially the same materials as those usable for the conductive layer 160. In the case where the conductive layer 171 is a microscopic line, the conductive layer 171 may be formed of any of the above-described materials usable for the gate electrode layer 145 and the source/drain electrode layer 147. In the case where the conductive layer 171 is formed of any of substantially the same material as those usable for the source/drain electrode layer 147, the conductivity of the conductive layer 171 is improved. This allows the touch sensor to respond at high speed.

A bank layer 157 is formed of an organic resin material to cover a periphery of the conductive layer 155 and to form a smooth step at an edge of the conductive layer 155. Usable organic resin materials include acrylic resin, polyimide and the like.

The sealing member 173 and the filling member 174 are each formed of an inorganic material, an organic material, or a composite material of an organic material and an inorganic material. The sealing member 173 and the filling member 174 may each be formed of, for example, epoxy resin, acrylic resin, silicone resin, phenol resin, polyimide resin, imide resin, silica gel or the like.

A color filter layer 175 has a function of transmitting light of a specific wavelength range. The color filter layer 175 transmits light of, for example, a red, green, blue or yellow wavelength range. In the case where light emitted from the organic EL layer 159 has different colors on a pixel-by-pixel basis, the color filter layer 175 may not be needed.

A light blocking layer 177 has a function of blocking light. The light blocking layer 177 may be formed of, for example, a resin containing a pigment dispersed therein, a dye-containing resin, an inorganic material such as black chromium or the like, carbon black, a composite oxide containing solid-solution of a plurality of inorganic oxides, or the like.

The flexible printed circuit board 108 may be electrically connected with the capacitor electrode layer 148a via an anisotropic conductive film 181.

The structure, method or the like described in embodiment 4 may be appropriately combined with a structure, method or the like shown in any other embodiment.

(Embodiment 5, Method for Manufacturing the Display Device)

Hereinafter, a method for manufacturing the display device 10 will be described with reference to FIG. 14 to FIG. 17.

(5-1. Formation of the Transistors and Inter-layer Insulating Layer)

Figure 14:
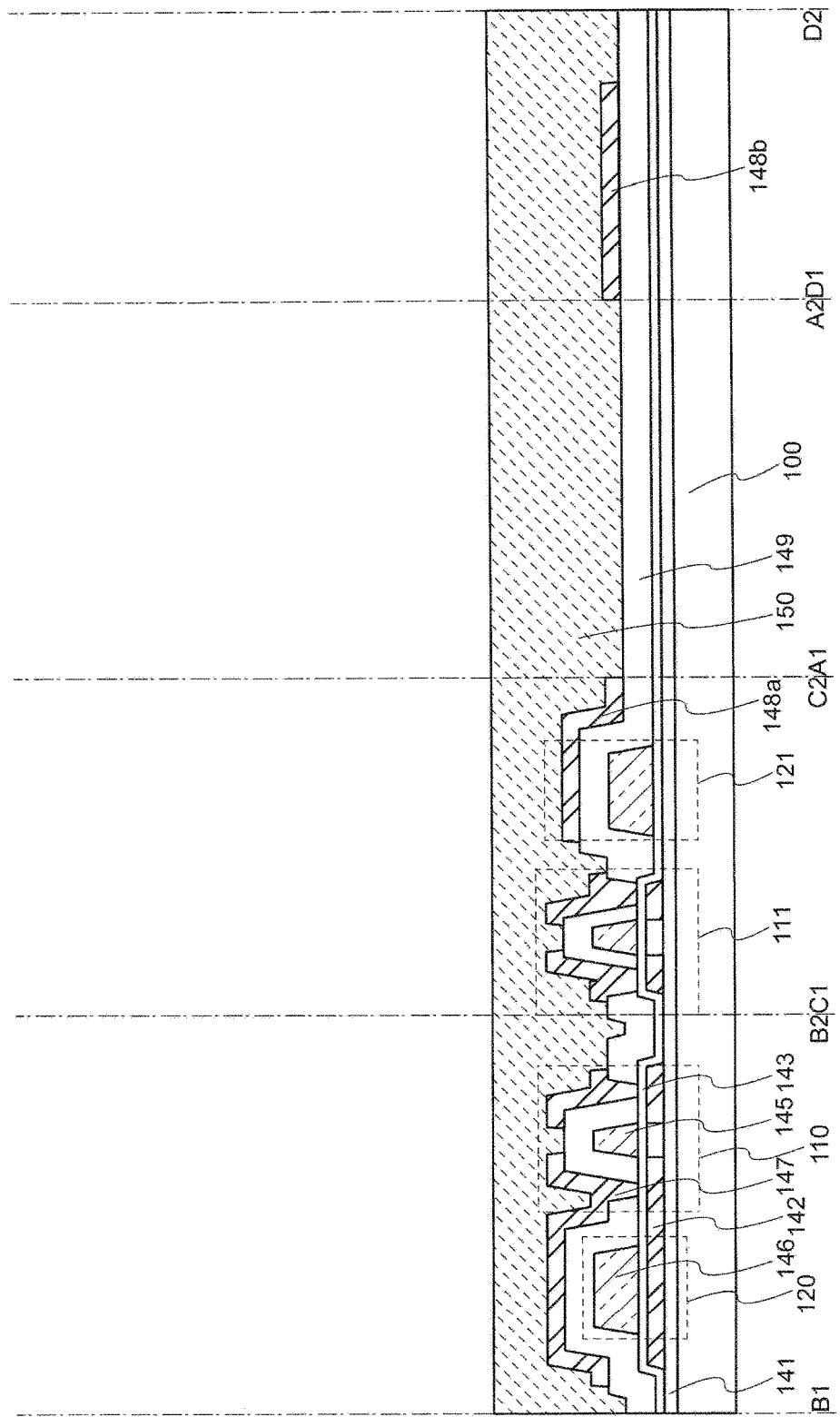
FIG. 14 is a cross-sectional view showing the method for manufacturing the display device in an embodiment according to the present invention.

As shown in FIG. 14, the following components are formed on a first surface (upper surface as seen in a cross-sectional view) of the substrate 100: the insulating layer 141, the transistor 110 in the pixel region B1-B2 (the transistor 110 is formed so as to include the semiconductor layer 142, the gate insulating layer 143 and the gate electrode layer 145), the capacitance element 120 (formed to include the capacitance electrode layer 146, the gate insulating layer 143, and the source/drain region of the semiconductor layer 142), the transistor 111 in the driving circuit region C1-C2, the capacitance element 121 (formed to include the capacitance electrode layer 146, the insulating layer 149, and the capacitor electrode layer 148a), the source/drain electrode layer 147, a terminal layer (conductive layer) 148b in the terminal region D1-D2, the insulating layer 149, and the insulating layer 150. The transistor 110 in the pixel region B1-B2 and the transistor 111 in the driving circuit region C1-C2 have the same structure with each other. The capacitor electrode layer 148a and the terminal layer 148b in the terminal region D1-D2 are formed on the insulating layer 149 and formed by the same conductive layer as the source/drain electrode layer 147. As the source/drain electrode layer 147, a stack of three layers, specifically, a titanium (Ti) layer, an aluminum (Al) layer and a titanium (Ti) layer provided in this order from the lower side may be formed. Each of these layers may be appropriately formed by photolithography, nanoimprinting, ink-jetting, etching or the like so as to have a predetermined shape.

Referring to FIG. 14, the insulating layer 149 may be a single layer or a stack of a plurality of layers. The insulating layer 149 is formed by, for example, stacking a silicon nitride film and a silicon oxide film. The insulating layer 149 is formed by CVD (plasma CVD or thermal CVD), sputtering or the like. The insulating layer 150 on the insulating layer 149 is formed of an organic insulating material. The organic insulating layer preferably contains a polymer material such as polyester, polyamide, polyimide, polysiloxane or the like. The insulating layer 150 of such an organic insulating material is formed on generally the entirety of the surface of the substrate 100 by spin-coating, ink-jetting, laminating, printing, dip-coating, vapor deposition polymerization or the like. The insulating layer 150 is preferably formed to have a thickness of 1 µm or greater. With such a thickness, the insulating layer 150 compensates for concaved and convexed portions provided by the transistor 110 or the like to provide a flat surface above the substrate 100.

(5-2. Formation of the Light Emitting Element)

Figure 15:
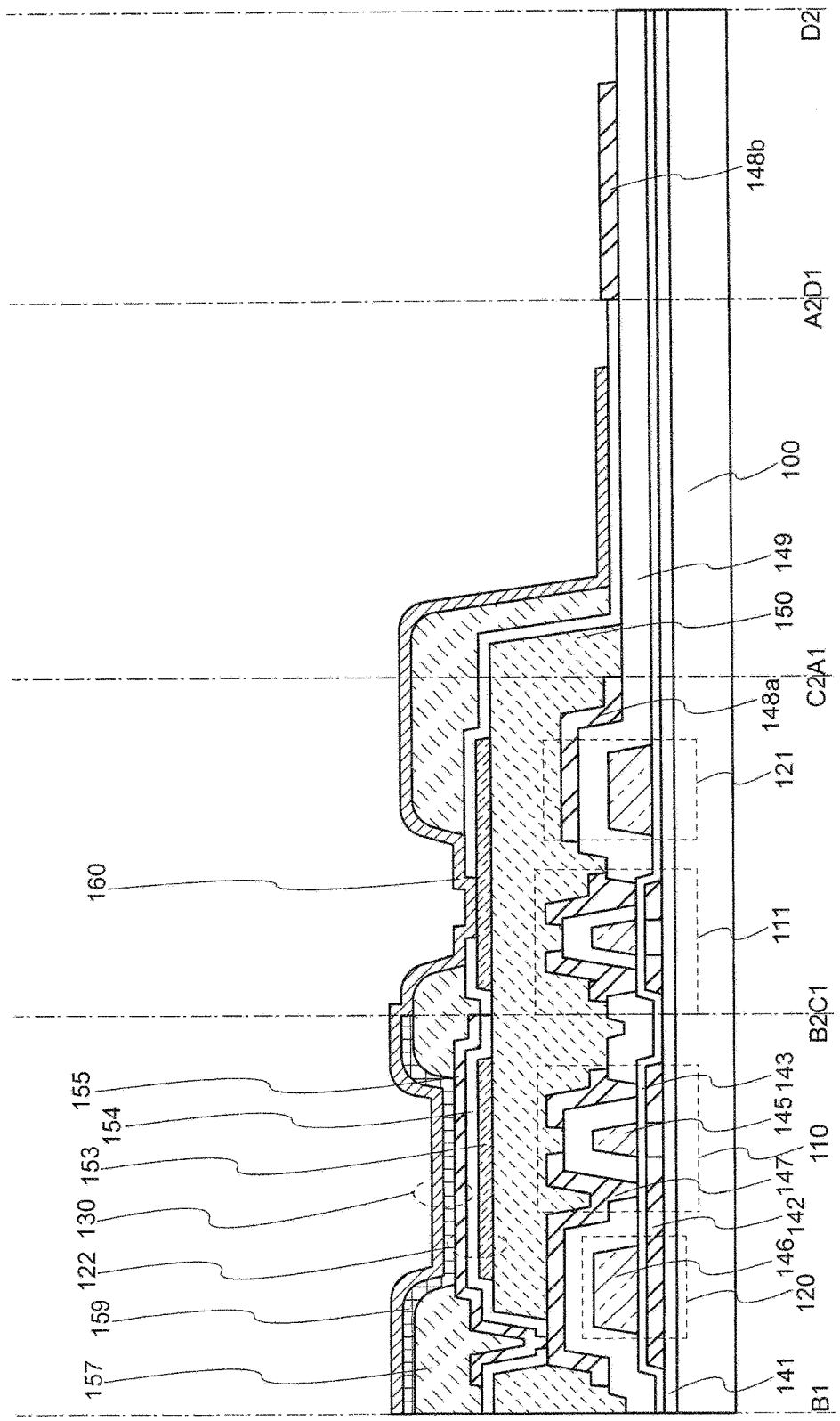
FIG. 15 is a cross-sectional view showing the method for manufacturing the display device in an embodiment according to the present invention.

Next, as shown in FIG. 15, the following components are formed on the insulating layer 150 in the pixel region B1-B2: the capacitance element 122 (formed to include the conductive layer 153, the insulating layer 154, and the conductive layer 155), the light emitting element 130 (formed to include the conductive layer 155, the organic EL layer 159, and the conductive layer 160), and the bank layer 157. Each of the components may be appropriately formed by photolithography, nanoimprinting, ink-jetting, etching or the like so as to have a predetermined shape.

The conductive layer 153 and the conductive layer 155 may be formed by sputtering, vapor deposition, plating or the like to have a thickness of several ten nanometers to several hundred nanometers. For example, the conductive layer 153 may be formed by stacking molybdenum, aluminum and molybdenum by use of sputtering. The conductive layer 155 may be formed by, for example, stacking ITO, silver and ITO by use of sputtering.

The insulating layer 154 may be formed of CVD (plasma DVD or thermal CVD), spin-coating, printing or the like. For example, the insulating layer 154 may be formed of silicon nitride by plasma CVD.

The bank layer 157 is formed to have an opening exposing an upper surface of the conductive layer 155. An edge of the opening of the bank layer 157 preferably has a smooth tapering shape. This improves the step coverage. The bank layer 157 may be formed so as not to be on an upper surface of the conductive layer 148b in the terminal region D1-D2, or may be formed to have an opening exposing the upper surface of the conductive layer 148b. The bank layer 157 may be formed to have a thickness of several micrometers. The bank layer 157 may be formed of polyimide by spin-coating.

The organic EL layer 159 is preferably formed to at least overlap the conductive layer 155. The organic EL layer 159 is formed by, for example, vacuum vapor deposition, printing, spin-coating or the like. In the case of being formed by vacuum vapor deposition, the organic EL layer 159 is preferably formed by use of a shadow mask so as not to be in the terminal region D1-D2. The organic EL layer 159 may be formed of different materials among pixels adjacent to each other, or may be formed of the same material in all the pixels. In the case where the organic EL layer 159 outputting white light is formed so as to be included in all the pixels, the color filter 175 or the like may be used, so that light of different colors is output from different pixels.

After the organic EL layer 159 is formed, the conductive layer 160 is formed. The conductive layer 160 is formed of a light transmissive conductive material by sputtering. In the case where, for example, the light emitting element 130 is of a top emission type, by which light is output from the conductive layer 160, the conductive layer 160 preferably has a uniform thickness.

The conductive layer 160 may be formed by vacuum vapor deposition or sputtering. The conductive layer 160 may not be formed in the terminal region D1-D2, or may be removed from the terminal region D1-D2 after being formed. The conductive layer 160 may be formed of IZO by sputtering.

(5-3. Formation of the Sealing Layer)

Figure 16:
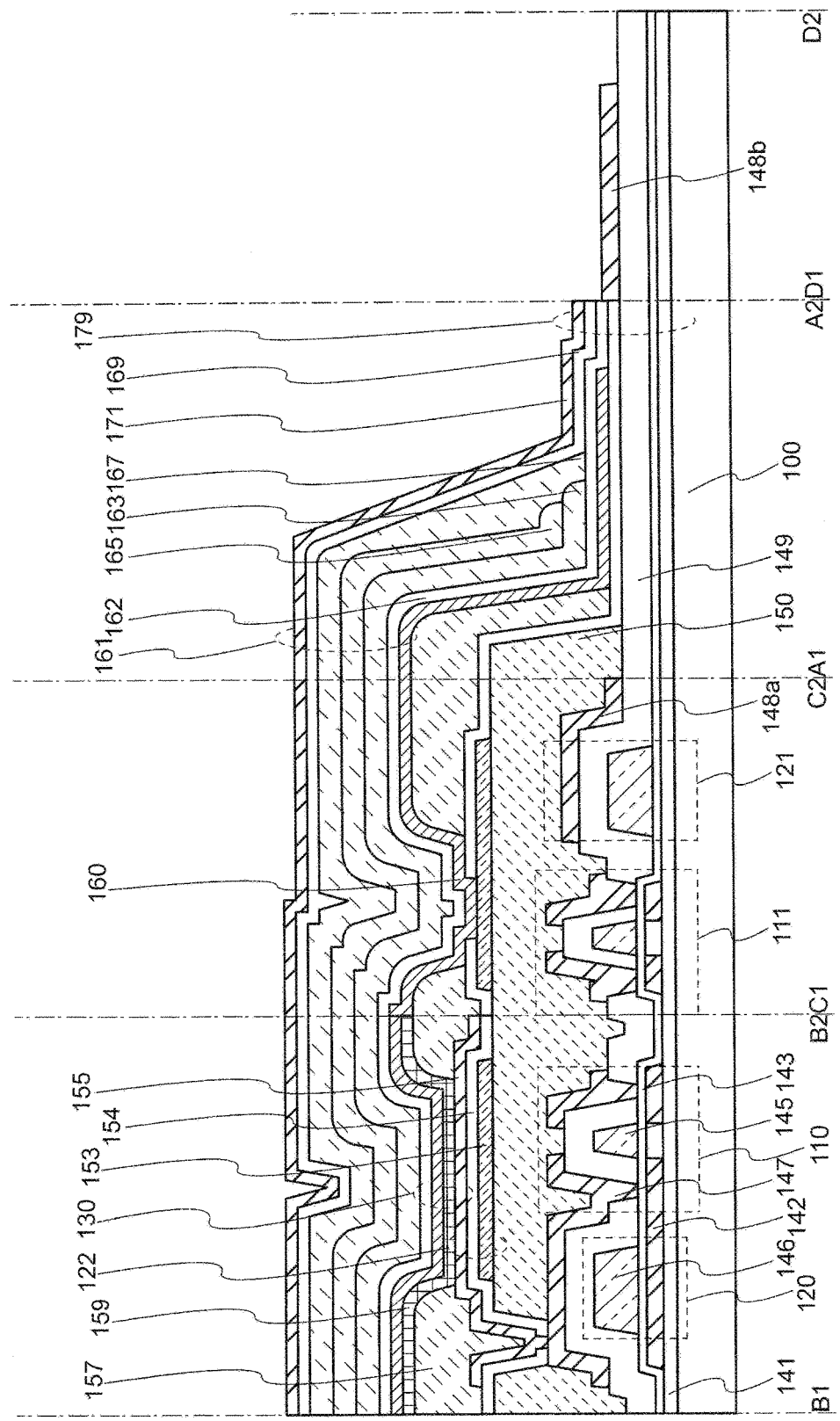
FIG. 16 is a cross-sectional view showing the method for manufacturing the display device in an embodiment according to the present invention.

Next, as shown in FIG. 16, the sealing layer 161 and the conductive layer 171 are formed on the conductive layer 160. The formation of the sealing layer 161 is described in embodiment 3 and will not be described here.

The peripheral region A1-A2 includes a region where the insulating layer 140 and the bank layer 157 have been removed. The insulating layer 154 is formed on a side surface of the insulating layer 150 and also on an upper surface of the insulating layer 149. The conductive layer 160 is formed on a side surface of the bank layer 157 and also on an upper surface of the insulating layer 154.

As described above, the peripheral region A1-A2 includes a region in which the insulating layer 150 and the bank layer 157, which are formed of an organic insulating material, have been removed, and in which the insulating layer 154 and the conductive layer 160, which are formed of an inorganic material, are formed. With such a structure, the insulating layer 150 and the bank layer 157, which are formed of an organic insulating material, are held between the layers each formed of an inorganic material. This structure prevents permeation of moisture or the like from the peripheral region A1-A2 into the pixel region B1-B2. The combination of the inorganic insulating layer 162 and the inorganic insulating layer 169 included in the sealing layer 161 in an embodiment according to present invention further enhances the moisture blocking effect. Therefore, the above-described region acts as a moisture blocking region 179, and the structure thereof may be considered as a "moisture blocking structure".

(5-4. Bonding of the Above-described Structure with a Counter Substrate, Joining of the Flexible Printed Circuit Board)

Figure 17:
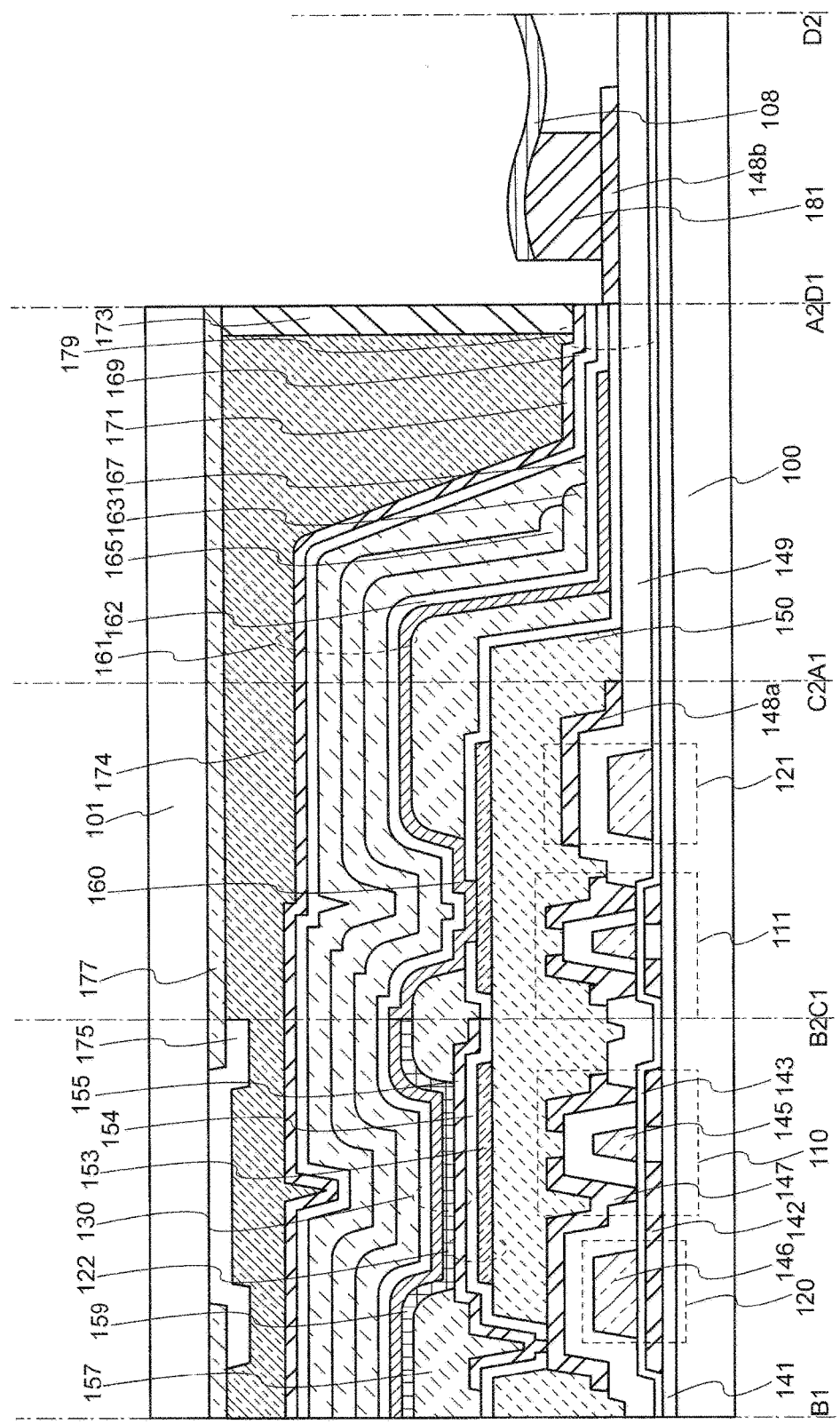
FIG. 17 is a cross-sectional view showing the method for manufacturing the display device in an embodiment according to the present invention.

Next, as shown in FIG. 17, the color filter layer 175 and the light blocking layer 177 are formed on the substrate 101, which acts as a counter substrate. Then, the substrate 101 and the substrate 100 are bonded together with the sealing member 173 and the filling member 174.

The light blocking layer 177 may be formed by spin-coating, spraying or ink-jetting. The light blocking layer 177 may be formed to have an opening in a region in the pixel region B1-B2 where light from the light emitting element 130 is output. For example, the light blocking layer 177 may be formed of a photosensitive organic resin containing a black pigment (i.e., formed of a black resist) by spin-coating.

The color filter layer 175 is formed, by printing, ink-jetting, etching using photolithography or the like, in the region in the pixel region B1-B2 where the light from the light emitting element 130 is output.

Before the substrate 100 and the substrate 101 are bonded together with the sealing member 173 and the filling member 174, a spacer or the like may be provided in advance in order to stabilize the distance between the substrate 100 and the substrate 101. The spacer may be formed of either an organic insulating material or an inorganic insulating material. In the case where the filling member 174 is formed of a photocurable adhesive, the filling member 174 is cured quickly and thus the work time is shortened.

The flexible printed circuit board 108 may be electrically connected with the conductive layer 148*b* by use of the anisotropic conductive film 181. At this point, it is preferable that the insulating layers included in the sealing film 161 (i.e., the inorganic insulating layer 162, the organic insulating layer 163, the organic insulating layer 165, and the inorganic insulating layer 169) may be removed from the terminal region D1-D2 by laser radiation or the like. The anisotropic conductive film 181 may be formed by application of a resin containing metal particles such as silver particles, copper particles or the like.

With the manufacturing method in the above-described embodiment, a display device having a high level of barrier property against moisture and also include a touch sensor having a stable shape is manufactured.

The structure, method or the like described in embodiment 5 may be appropriately combined with a structure, method or the like shown in any other embodiment.

What is claimed is:

1. A display device, comprising:
   a display region including a plurality of light emitting elements arrayed in a matrix;
   a first inorganic insulating layer covering the plurality of light emitting elements;
   a first organic insulating layer on the first inorganic insulating layer;
   a second organic insulating layer on the first organic insulating layer;
   a third organic insulating layer on the second organic insulating layer; and
   a second inorganic insulating layer on the third organic insulating layer,
   wherein
   an edge of the first organic insulating layer, an edge of the second organic insulating layer, and an edge of the third organic insulating layer are located between an edge of the first inorganic insulating layer and the display region,
   the edge of the second organic insulating layer is located between the edge of the first organic insulating layer and the display region,
   the edge of the first organic insulating layer is located between the edge of the second organic insulating layer and the edge of the third organic insulating layer,
   the third organic insulating layer covers the edge of the first organic insulating layer and the edge of the second organic insulating layer, and
   the edges of the first inorganic insulating layer and the second inorganic insulating layer are located outer to the edge of the display region and the edges of the first to third organic insulating layers.

2. The display device according to claim 1, wherein the first inorganic insulating layer and the second inorganic insulating layer are in contact with each other at a position outer to the edge of the third organic insulating layer.

3. The display device according to claim 1, further comprising:

a third inorganic insulating layer between the first organic insulating layer and the second organic insulating layer; and a fourth inorganic insulating layer between the second organic insulating layer and the third organic insulating layer.

4. The display device according to claim 1, wherein the edges of the first to third organic insulating layers are tapered.

5. The display device according to claim 1, wherein the edges of the first to third organic insulating layers each have a rounded shape in a cross-sectional view.

6. The display device according to claim 1, further comprising:

a line layer on the second inorganic insulating layer, the line layer extending from the display region to a position outer to the third organic insulating layer, wherein the line layer has a first line width in an area thereof overlapping the display region and has a second line width greater than the first line width in an area thereof overlapping the edges of the first to third organic insulating layers.

* * * * *